US007965029B2

(12) United States Patent
Tsai

(10) Patent No.: US 7,965,029 B2

(45) Date of Patent: Jun. 21, 2011

(54) LIGHT-EMITTING DIODE ILLUMINATION APPARATUS

(75) Inventor: Wen-Kuei Tsai, Taipei County (TW)

(73) Assignee: Top Energy Saving System Corp., Taipei County (TW)

( * ) Notice: Subject to any disclaimer, the term of this patent is extended or adjusted under 35 U.S.C. 154(b) by 15 days.

(21) Appl. No.: 12/539,612

(22) Filed: Aug. 12, 2009

(65) Prior Publication Data

US 2010/0039013 A1 Feb. 18, 2010

Related U.S. Application Data

(60) Provisional application No. 61/088,356, filed on Aug. 13, 2008.

(30) Foreign Application Priority Data

Jul. 28, 2009 (TW) ............................... 98125332 A

(51) Int. Cl.
*H01L 33/00* (2010.01)

(52) U.S. Cl. .......... 313/498; 313/46; 313/512; 315/112; 362/294

(58) Field of Classification Search .................... 313/46, 313/498, 512; 315/112; 362/294
See application file for complete search history.

(56) References Cited

U.S. PATENT DOCUMENTS

2003/0039122 A1* 2/2003 Cao .............................. 362/294
2007/0159827 A1 7/2007 Huang
2007/0230184 A1 10/2007 Shuy
2008/0024067 A1 1/2008 Ishibashi

FOREIGN PATENT DOCUMENTS

JP 2003-178602 6/2003

OTHER PUBLICATIONS

"Search Report of European counterpart application", issued on Oct. 26, 2009, p. 1-p. 7.

* cited by examiner

*Primary Examiner* — Nimeshkumar D Patel
*Assistant Examiner* — Mary Ellen Bowman
(74) *Attorney, Agent, or Firm* — Muncy, Geissler, Olds & Lowe, PLLC

(57) ABSTRACT

A light-emitting diode (LED) illumination apparatus including a housing, an LED light source, and a power supply unit is provided. The housing has a light source accommodating space, a power supply accommodating space and a thermal isolation channel linked to the atmosphere, wherein the thermal isolation channel is located between the light source accommodating space and the power supply accommodating space. The LED light source is disposed in the light source accommodating space and the power supply unit is disposed in the power supply accommodating space. The thermal isolation channel is capable of preventing thermal interference between the LED light source and the power supply unit.

6 Claims, 3 Drawing Sheets

LIGHT-EMITTING DIODE ILLUMINATION APPARATUS

CROSS-REFERENCE TO RELATED APPLICATION

This application claims the priority benefits of U.S. provisional application Ser. No. 61/088,356, filed on Aug. 13, 2008 and of Taiwan patent application serial no. 98125332, filed on Jul. 28, 2009. The entirety of each of the above-mentioned patent applications is hereby incorporated by reference herein and made a part of specification.

BACKGROUND OF THE INVENTION

1. Field of the Invention

The invention relates to a light-emitting diode (LED) illumination apparatus and particularly to an LED illumination apparatus having favorable efficiency in heat dissipation.

2. Description of Related Art

A light-emitting diode (LED) is a semiconductor element, and the material for forming a light-emitting chip of an LED mainly includes chemical elements selected from groups III-V, such as gallium phosphide (GaP), gallium arsenide (GaAs), and other compound semiconductors. The light-emitting principle is converting electric energy into light, namely applying electric current to a compound semiconductor, so that redundant energy is released in the form of light through the combination of electrons and electron holes, thereby achieving light-emitting effects. Since the light-emitting phenomenon of LED is not caused by heating or discharging, the lifespan of LED is more than 100,000 hours, and idling time is saved. Moreover, LED has the advantages of quick response speed (about $10^{-9}$ seconds), compact size, low power consumption, low pollution, high reliability, capability for mass production, etc. Therefore, the application of LED is fairly extensive, for example, mega-size outdoor display boards, traffic lights, cell phones, light sources of scanners, illumination devices, and so forth.

In recent years, as the brightness and light-emitting efficiency of LED are being improved and the mass production of white light LEDs is carried out successfully, white light LEDs are used in illumination devices increasingly, such as indoor illuminators, outdoor illuminators and so forth. Generally speaking, high-power LEDs all encounter heat dissipation problems. When an LED is operated in an overly high temperature, the brightness of the LED illumination apparatus may be reduced and the lifespan of the LED may be shortened. Therefore, how to design a proper heat dissipation system for LED illumination apparatuses has become a focus to researchers and designers in this field. According to the design of the heat dissipation system of a conventional LED illumination apparatus, the light source and the power supply are operated in nearly the same temperature. However, the optimal operation temperatures for the light source and the power supply are different. The conventional heat dissipation design cannot provide optimal temperatures for the light source and the power supply to operate. Consequently, the lifespan of the LED illumination apparatus is affected.

SUMMARY OF THE INVENTION

The invention provides an LED illumination apparatus having favorable efficiency in heat dissipation and longer lifespan.

The invention provides an LED illumination apparatus including a housing, an LED light source, and a power supply unit. The housing has a light source accommodating space, a power supply accommodating space, and a first thermal isolation channel linked to an atmosphere, wherein the first thermal isolation channel is located between the light source accommodating space and the power supply accommodating space. The LED light source is disposed inside the light source accommodating space, and the power supply unit is disposed inside the power supply accommodating space.

In one embodiment of the invention, the housing includes a bulb case.

In one embodiment of the invention, the bulb case includes a upper housing, an electrode portion, a bottom housing, and a light-transmissive portion. The upper housing defines the power supply accommodating space for containing the power supply unit. The electrode portion is connected with an end of the upper housing, wherein the electrode portion and the power supply unit are electrically connected. An end of the bottom housing is connected with the other end of the upper housing, wherein the bottom housing defines the first thermal isolation channel. The light-transmissive portion is connected with the other end of the bottom housing, wherein the bottom housing and the light-transmissive portion together define the light source accommodating space for containing the LED light source.

In one embodiment of the invention, the upper housing is an insulation housing.

In one embodiment of the invention, the bottom housing is a thermal conductive housing.

In one embodiment of the invention, the bottom housing includes a plurality of heat sinks.

In one embodiment of the invention, the light-transmissive portion is a mat light-transmissive portion or a transparent light-transmissive portion.

In one embodiment of the invention, the housing is a street lamp cover.

In one embodiment of the invention, the street lamp cover includes a upper lamp cover, a bottom lamp cover, and a light-transmissive portion. The upper lamp cover defines the power supply accommodating space for containing the power supply unit, wherein the upper lamp cover has a plurality of gas circulation holes. An end of the bottom lamp cover is connected with the other end of the upper lamp cover, wherein the first thermal isolation channel is located between the upper lamp cover and the bottom lamp cover, and the gas circulation holes communicate with the first thermal isolation channel. The light-transmissive portion is connected with the other end of the bottom lamp cover, wherein the bottom lamp cover and the light-transmissive portion together define the light source accommodating space for containing the LED light source.

In one embodiment of the invention, the street lamp cover further includes a shielding plate connected with the upper lamp cover, and the shielding plate is positioned above the power supply unit.

In one embodiment of the invention, the street lamp cover includes a second thermal isolation channel which is located between the shielding plate and the upper lamp cover.

In one embodiment of the invention, the LED light source includes a circuit board and a plurality of LED chips. The LED chips are disposed on the circuit board and electrically connected with the circuit board.

In one embodiment of the invention, the LED illumination apparatus further includes a connection wire which passes through the first thermal isolation channel and is electrically connected with the power supply unit and the LED light source.

In one embodiment of the invention, a thermal isolation material is filled in the first thermal isolation channel, so as to prevent interference between heat dissipation systems of the power supply unit and the LED light source.

Since the LED illumination apparatus of the invention has the thermal isolation channel linked to the atmosphere for heat dissipation, the overall operation temperature of the LED illumination apparatus is maintained within a tolerable range. Because of the thermal isolation channel, the LED light source and the power supply unit can respectively function in optimal temperatures.

In order to make the aforementioned and other features and advantages of the invention more comprehensible, several embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
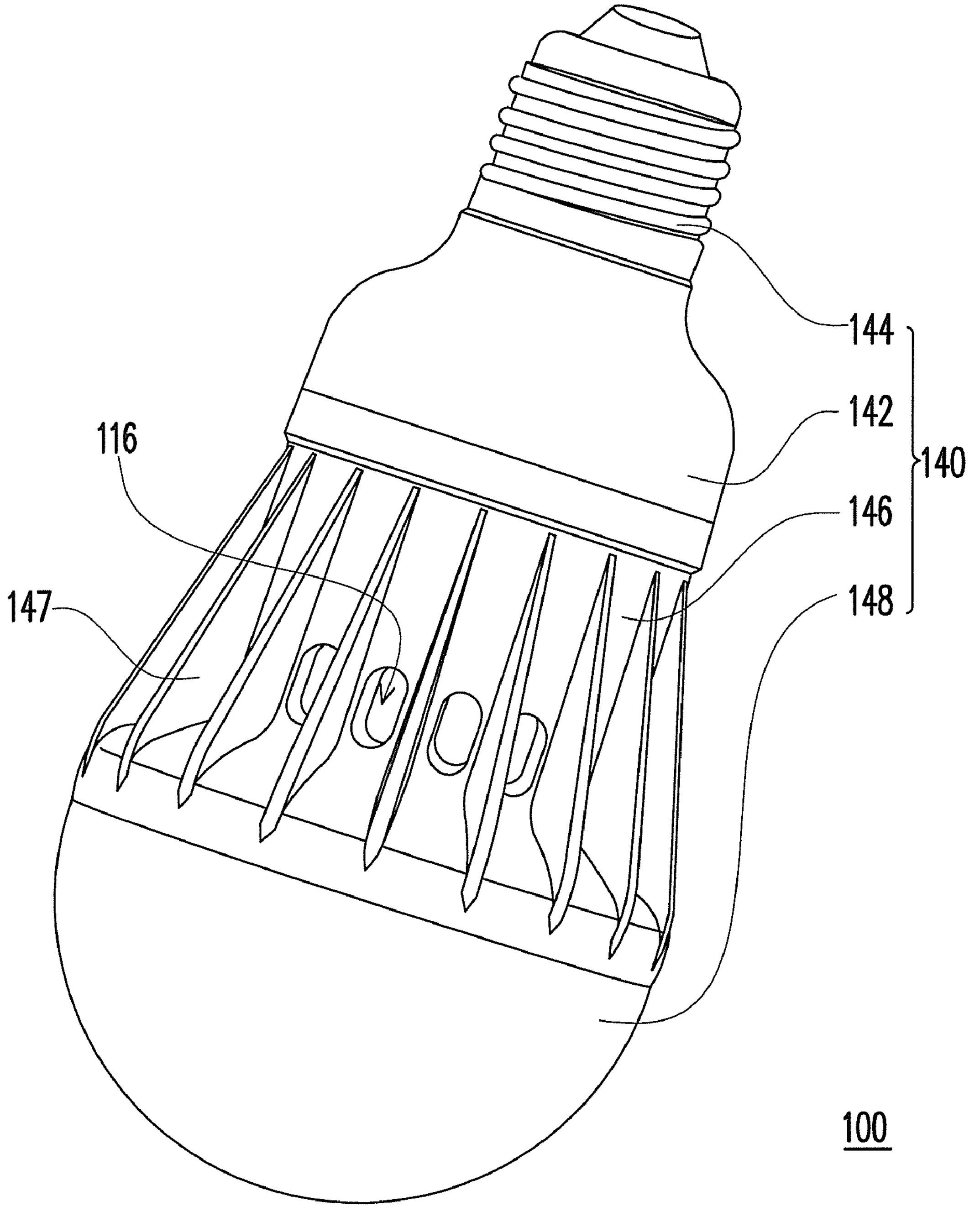
FIG. 1A is a schematic perspective view of an LED illumination apparatus according to the first embodiment of the invention.
Figure 1B:
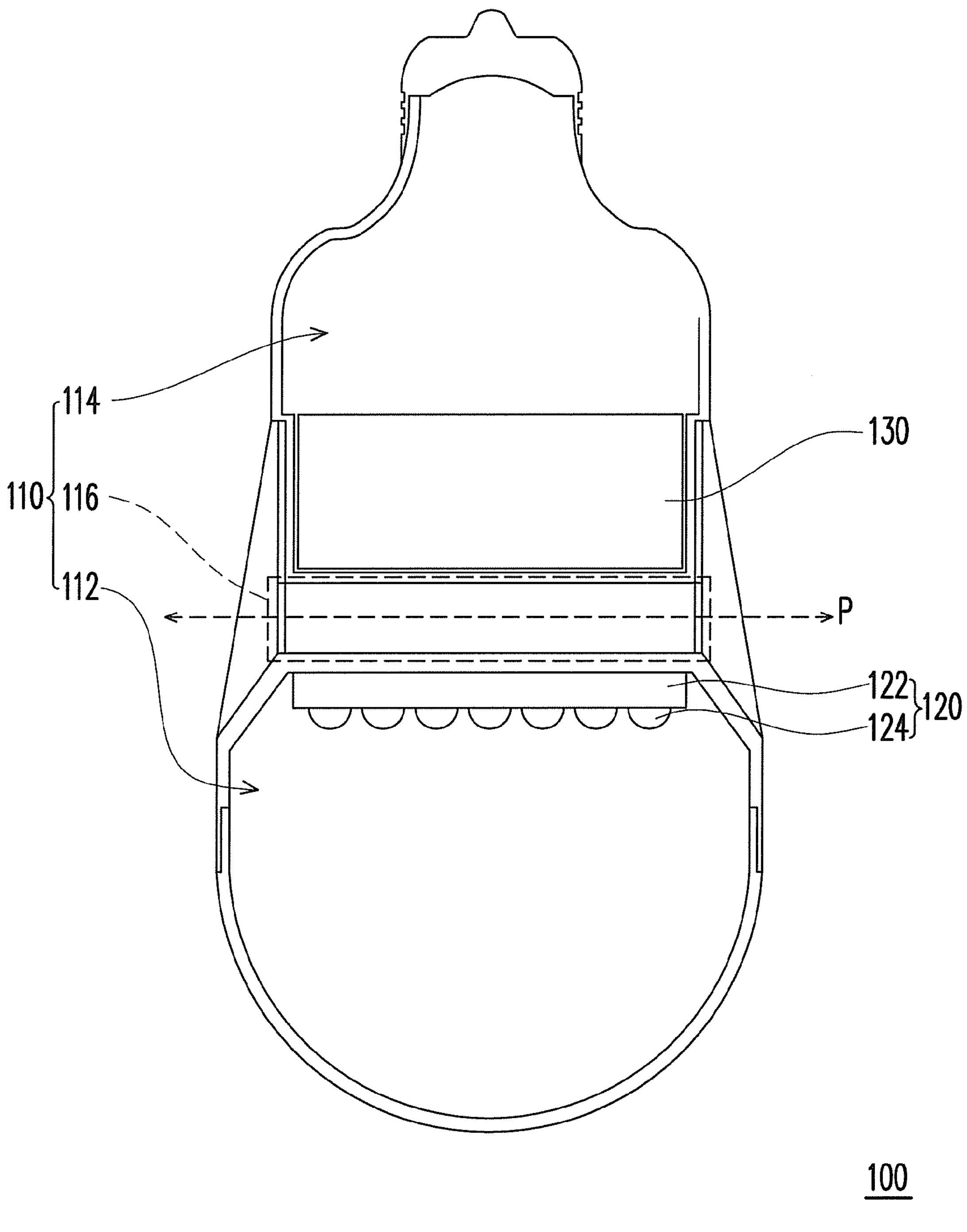
FIG. 1B is a schematic cross-sectional view of the LED illumination apparatus in FIG. 1A.

FIG. 1A is a schematic perspective view of an LED illumination apparatus according to the first embodiment of the invention. FIG. 1B is a schematic cross-sectional view of the LED illumination apparatus in FIG. 1A. Referring to FIG. 1A and FIG. 1B, in this embodiment, an LED illumination apparatus 100 includes a housing 110, an LED light source 120, and a power supply unit 130. The housing 110 has a light source accommodating space 112, a power supply accommodating space 114, and a first thermal isolation channel 116 linked to an atmosphere, wherein the first thermal isolation channel 116 is located between the light source accommodating space 112 and the power supply accommodating space 114. The LED light source 120 and the power supply unit 130 are respectively disposed in the light source accommodating space 112 and the power supply accommodating space 114.

The housing 110, the LED light source 120, and the power supply unit 130 can have various configurations. The structure illustrated in FIG. 1A and FIG. 1B is merely one of the examples for persons having ordinary knowledge in the art to understand and embody the invention and should not limit the scope of the invention.

As shown in FIG. 1A and FIG. 1B, the LED illumination apparatus 100 of this embodiment is an LED light bulb. The LED light bulb is, for example, an E27 light bulb, an E26 light bulb, an E14 light bulb, or a light bulb of other type. More specifically, the housing 110 of this embodiment has a bulb case 140, and the bulb case 140 includes a upper housing 142, an electrode portion 144, a bottom housing 146, and a light-transmissive portion 148. The upper housing 142 defines the power supply accommodating space 114 for containing the power supply unit 130. The electrode portion 144 is connected with an end of the upper housing 142, wherein the electrode portion 144 and the power supply unit 130 are electrically connected. An end of the bottom housing 146 is connected with the other end of the upper housing 142, wherein the bottom housing 146 defines the first thermal isolation channel 116. The light-transmissive portion 148 is connected with the other end of the bottom housing 146, wherein the bottom housing 146 and the light-transmissive portion 148 together define the light source accommodating space 112 for containing the LED light source 120. Moreover, the light-transmissive portion 148 is a mat light-transmissive portion, which allows light emitted by the LED light source 120 to pass therethrough for illumination. However, in other embodiments, the light-transmissive portion 148 can be a transparent light-transmissive portion. Similarly, the light emitted by the LED light source 120 can pass through the transparent light-transmissive portion to achieve illumination. In addition, the electrode portion 144 of this embodiment is, for example, an E27 lamp holder, an E26 lamp holder, an E14 lamp holder, or a lamp holder of other type.

Considering the safety of the user, the upper housing 142 is usually made of an isolation material (such as plastic), so as to prevent an electric shock. In an exemplary embodiment of the invention, the upper housing 142 is made of an isolation material doped with zinc oxide, for instance. Because the isolation material doped with zinc oxide has the properties of shielding electromagnetic interference (EMI shielding), the upper housing 142 which contains zinc oxide effectively shields electromagnetic waves generated by the LED illumination apparatus 100 and reduces the harm of electromagnetic waves to the user. Moreover, the upper housing 142 can be fabricated by injection-molding technology. Because the isolation material is doped with zinc oxide, serious deformation problems rarely happen when the upper housing 142 is demolded. Consequently, the production yield rate of the upper housing 142 is increased, and the heat dissipation efficiency of the upper housing 142 is enhanced. Furthermore, in this embodiment, the upper housing 142 is formed in one piece, for example. However, in other embodiments, the upper housing 142 can be formed by two pieces.

Referring to FIG. 1A and FIG. 1B, the bottom housing 146 includes a plurality of heat sinks 147. Two ends of the first thermal isolation channel 116 are, for example, located between adjacent two heat sinks 147. Air that flows along a gas circulation path P of FIG. 1B into the first thermal isolation channel 116 facilitates the heat dissipation of the LED illumination apparatus 100. The first thermal isolation channel 116 between the light source accommodating space 112 and the power supply accommodating space 114 not only increases a heat exchange area for facilitating heat dissipation of the apparatus 100 but also prevents heat of the power supply unit 130 and the LED light source 120 from interfering with each other through thermal conduction, further to achieve heat shielding. Additionally, when the power supply unit 130 and the LED light source 120 are electrically connected by a connection wire, a portion of the connection wire that passes through the first thermal isolation channel 116 can be waterproofed, so as to prevent electric leakage. In this embodiment, the bottom housing 146 is made from a single material or multiple types of materials. Generally speaking, the material of the bottom housing 146 includes copper, aluminum, alloy, or other thermal-conductive materials such as ceramics. Moreover, the upper housing 142 and the bottom housing 146 can have a heat dissipation paint coated thereon, so as to enhance the effect of heat dissipation of the housings.

As shown in FIG. 1B, the LED light source 120 is, for example, an LED package. The LED package is, for example, a chip-on-board type package or a package of other type. To be more detailed, the LED light source 120 includes a circuit board 122 and a plurality of LED chips 124. The LED chips 124 are disposed on the circuit board 122 and electrically connected with the circuit board 122, so as to form an LED array. The circuit board 122, for example, has a single-layer circuit or a multi-layer circuit and has favorable thermal conductivity. Moreover, a circuit substrate made of copper, aluminum, or ceramics, for example, is adopted to fabricate the circuit board 122, such that the circuit board 122 has favorable thermal conductivity. In other embodiments, a single LED module can serve as the LED light source 120 in the LED illumination apparatus 100. In this embodiment, the LED light source 120 is welded onto the bottom housing 146 by a solder material, so as to effectively transmit the heat generated by the LED light source 120 to the bottom housing 146. Certainly, this embodiment can also utilize a thermal paste or a thermal-conductive material of other type in combination with screws to bond the LED light source 120 and the bottom housing 146.

Second Embodiment

Figure 2:
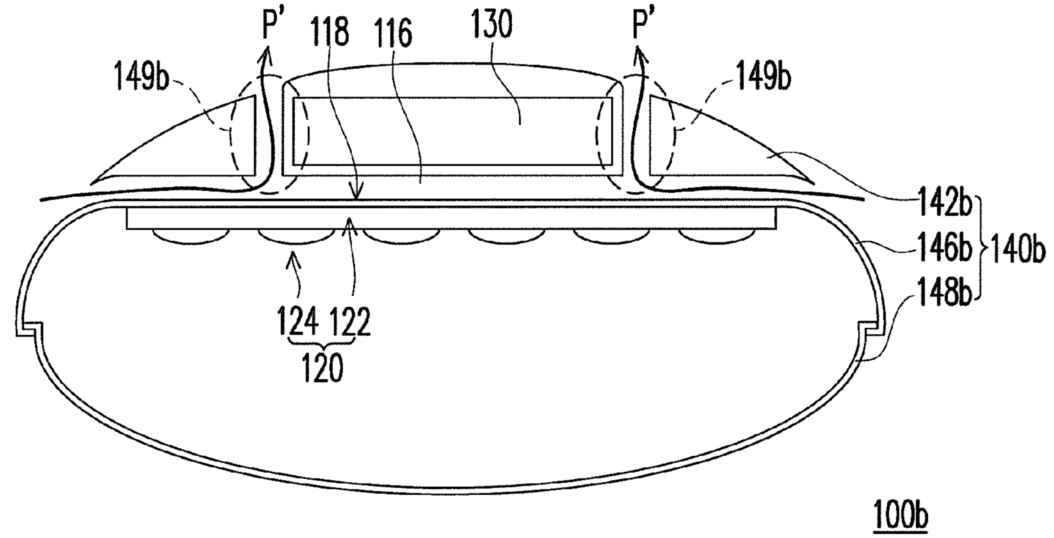
FIG. 2 is a schematic cross-sectional view of an LED illumination apparatus according to the second embodiment of the invention.

FIG. 2 is a schematic cross-sectional view of an LED illumination apparatus according to the second embodiment of the invention. With reference to FIG. 2, an LED illumination apparatus **100*b* of this embodiment is similar to the illumination apparatus of the first embodiment and includes a housing 110, an LED light source 120, and a power supply unit 130. In this embodiment, the housing 110 is a street lamp cover 140*b* which includes a upper lamp cover 142*b*, a bottom lamp cover 146*b*, and a light-transmissive portion 148*b***.

More specifically, the upper lamp cover **142*b* defines the power supply accommodating space 114 for containing the power supply unit 130, wherein the upper lamp cover 142*b* has a plurality of gas circulation holes 149*b*. An end of the bottom lamp cover 146*b* is connected with the other end of the upper lamp cover 142*b*, wherein the first thermal isolation channel 116 is located between the upper lamp cover 142*b* and the bottom lamp cover 146*b*, and the gas circulation holes 149*b* communicate with the first thermal isolation channel 116. The light-transmissive portion 148*b* is connected with the other end of the bottom lamp cover 146*b*, wherein the bottom lamp cover 146*b* and the light-transmissive portion 148*b* together define the light source accommodating space 112 for containing the LED light source 120**.

It is noted that, because the upper lamp cover **142*b* has the first thermal isolation channel 116 and the gas circulation holes 149*b*, gas from the outside is introduced via two ends of the first thermal isolation channel 116 to circulate between the upper lamp cover 142*b* and the bottom lamp cover 146*b* and is released from the LED illumination apparatus 100*b* via the gas circulation holes 149*b*. The aforesaid is a gas circulation path P'. This embodiment is capable of effectively releasing the heat generated by the LED light source 120 and the power supply unit 130, which facilitates the heat dissipation of the LED illumination apparatus 100*b*. Moreover, the bottom lamp cover 146*b* has a surface 118 toward the first thermal isolation channel 116, and the surface 118 can also be formed as a curved surface for improving water drainage when the LED illumination apparatus 100*b*** is used outdoors.

According to FIG. 2, the LED light source 120 includes a circuit board 122 and a plurality of LED chips 124. The LED chips 124 are disposed on the circuit board 122 and electrically connected with the circuit board 122, so as to form an LED array. The circuit board 122 has a single-layer circuit or a multi-layer circuit, for example, and has favorable thermal conductivity. In addition, a circuit substrate made of copper, aluminum, or ceramics, for example, is adopted to fabricate the circuit board 122, such that the circuit board 122 has favorable thermal conductivity. Certainly, a single LED module can also serve as the LED light source 120 of the illumination apparatus **10*b***.

Furthermore, the LED illumination apparatus **100*b* of this embodiment can be designed as an assembly of a plurality of independent elements. Given some of the elements of the LED illumination apparatus 100*b* are damaged, e.g. the power supply unit 130** is overheated and malfunctions, only the damaged elements need to be replaced. Since it is not required to replace the whole illumination apparatus, the costs of maintenance are saved.

The Third Embodiment

Figure 3:
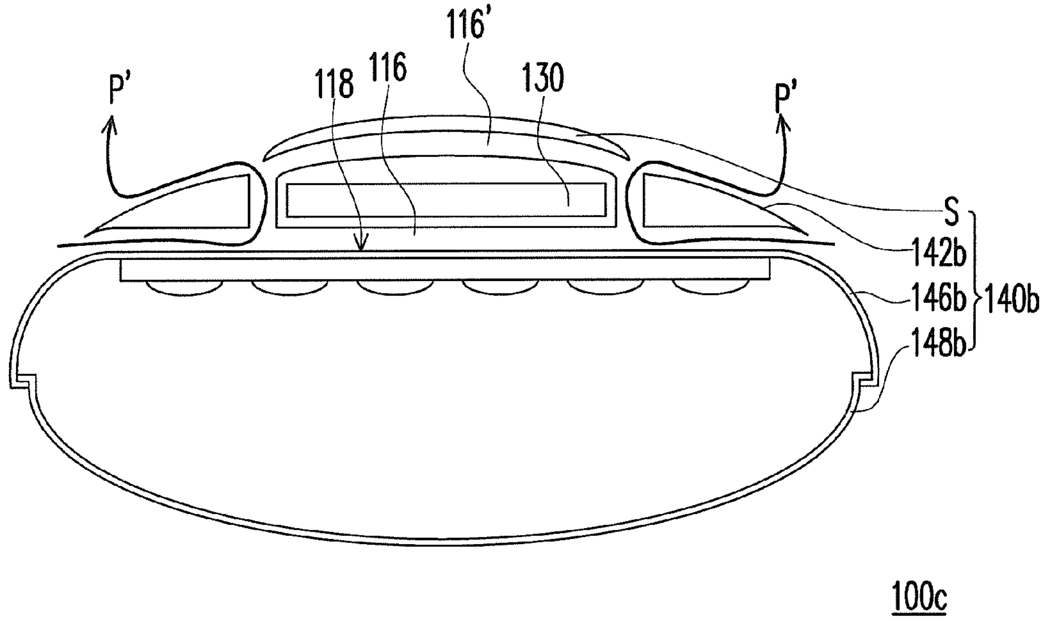
FIG. 3 is a schematic cross-sectional view of an LED illumination apparatus according to the third embodiment of the invention.

FIG. 3 is a schematic cross-sectional view of an LED illumination apparatus according to the third embodiment of the invention. Referring to FIG. 3, an LED illumination apparatus **100*c* of this embodiment is similar to the LED illumination apparatus 100*b* of the second embodiment. The main difference between the foregoing apparatuses lies in that: the street lamp cover 140*b* of this embodiment further includes a shielding plate S positioned above the power supply unit 130, wherein the shielding plate S is connected with the upper lamp cover 142*b* to form a second thermal isolation channel 116' between the shielding plate S and the upper lamp cover 142*b***.

When the LED illumination apparatus **100*c* is used outdoors, the shielding plate S shields the power supply unit 130 from strong sunlight, which may overheat the power supply unit 130 and cause damage. In addition, the second thermal isolation channel 116' performs functions similar to the first thermal isolation channel 116, which are for facilitating the heat dissipation and heat insulation of the power supply unit 130**. Generally speaking, a material of the shielding plate S includes copper, aluminum, alloy, or other thermal-conductive materials.

Further to the above, the elements of the LED illumination apparatus of the invention can have other kinds of arrangements. Thus, the above-described embodiments are not intended to limit the way of arranging the elements of the invention.

Based on the above, the LED illumination apparatus of the invention has the thermal isolation channel for facilitating heat dissipation of the apparatus. In some of the embodiments of the invention, the LED illumination apparatus has gas circulation holes and thermal isolation channel. Accordingly, the operation temperature of the illumination apparatus is effectively maintained within a tolerable range.

Although the invention has been described with reference to the above embodiments, it will be apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A light-emitting diode (LED) illumination apparatus, comprising:

a housing comprising a light source accommodating space, a power supply accommodating space, and a first thermal isolation channel linked to an atmosphere, wherein the first thermal isolation channel is located between the light source accommodating space and the power supply accommodating space;

an LED light source disposed in the light source accommodating space; and a power supply unit disposed in the power supply accommodating space;

wherein the housing is a street lamp cover, and the street lamp cover comprises:

a upper lamp cover defining the power supply accommodating space containing the power supply unit, wherein the upper lamp cover has a plurality of gas circulation holes, each gas circulation hole includes an inlet and an outlet, and each outlet communicates with the atmosphere;

a bottom lamp cover having an end connected with the other end of the upper lamp cover, wherein the first thermal isolation channel is located between the upper lamp cover and the bottom lamp cover, and each inlet of the gas circulation holes communicates with the first thermal isolation channel; and a light-transmissive portion connected with the bottom lamp cover, wherein the bottom lamp cover and the light-transmissive portion together define the light source accommodating space containing the LED light source.

2. The LED illumination apparatus as claimed in claim 1, wherein the street lamp cover further comprises a shielding plate connected with the upper lamp cover, and the shielding plate is positioned above the power supply unit.

3. The LED illumination apparatus as claimed in claim 2, wherein the street lamp cover further comprises a second thermal isolation channel, wherein the second thermal isolation channel is located between the shielding plate and the upper lamp cover.

4. The LED illumination apparatus as claimed in claim 1, wherein the LED light source comprises:

a circuit board; and a plurality of LED chips disposed on and electrically connected with the circuit board.

5. The LED illumination apparatus as claimed in claim 1, further comprising a connection wire passing through the first thermal isolation channel and electrically connected to the power supply unit and the LED light source.

6. The LED illumination apparatus as claimed in claim 1, further comprising a thermal isolation material filled in the first thermal isolation channel between the light source accommodating space and the power supply accommodating space, so as to prevent interference between heat dissipation systems of the power supply unit and the LED light source.

* * * * *